United States Patent [19]

Porter et al.

[11] Patent Number: 5,304,506
[45] Date of Patent: Apr. 19, 1994

[54] ON CHIP DECOUPLING CAPACITOR

[75] Inventors: Stephen R. Porter; Navjot Chhabra, both of Boise, Id.

[73] Assignee: Micron Semiconductor, Inc., Boise, Id.

[21] Appl. No.: 29,088

[22] Filed: Mar. 10, 1993

[51] Int. Cl.⁵ ............................................. H01L 21/70
[52] U.S. Cl. ....................................... 437/60; 437/47; 437/919
[58] Field of Search ........................ 437/47, 60, 919; 257/532, 535

[56] References Cited

U.S. PATENT DOCUMENTS

| | | | |
|---|---|---|---|
| 4,295,264 | 10/1981 | Rogers | 437/919 |
| 4,931,897 | 6/1990 | Tsukamoto et al. | 257/532 |
| 5,108,941 | 4/1992 | Paterson et al. | 437/919 |
| 5,130,267 | 7/1992 | Kaya et al. | 437/919 |

*Primary Examiner*—Tom Thomas
*Attorney, Agent, or Firm*—David J. Paul

[57] ABSTRACT

The present invention discloses an on chip decoupling capacitor structure having a first decoupling capacitor with one electrode formed in the conductively doped silicon substrate and a second electrode made of conductively doped polysilicon. The second electrode is a common electrode to a second decoupling capacitor overlying and thereby coupled in parallel to said first decoupling capacitor. The second capacitor's first electrode is the common electrode and its second electrode is made of conductively doped polysilicon. The electrodes made of the conductively doped polysilicon may be further enhanced by forming a silicided material, such as tungsten silicide, thereon. The decoupling capacitors' dielectric can be formed from high dielectric constant materials, such as TEOS, oxide, nitride or any combination thereof. The second decoupling capacitor could be fabricated over field oxide and used as a single capacitor having a first and second conductively doped polysilicon electrodes (either silicided or non-silicided) with a capacitor dielectric sandwiched in between.

14 Claims, 2 Drawing Sheets

ON CHIP DECOUPLING CAPACITOR

FIELD OF THE INVENTION

This invention relates to semiconductor technology, and more specifically to an on chip decoupling capacitor and a process to fabricate same.

BACKGROUND OF THE INVENTION

Decoupling capacitors on semiconductor devices are essential components used to filter much of the noise that may be present between operating supplies such as power and ground. Some fabrication processes construct decoupling capacitors on a silicon substrate by forming one electrode into the substrate itself and then forming a second electrode out of an overlying conductive material with the two electrodes being separated by a dielectric material.

The formation of the decoupling capacitors in such a fashion leaves the substrate and capacitor dielectric susceptible to subsequent process steps, such as, future dopant implants that can penetrate into the silicon substrate and thereby causing "popping" where the two electrodes short together through the capacitor dielectric. Also, subsequent plasma etches can cause further damage reducing the overall surface area of the second electrode if it is not protected. Studies have shown that there is a correlation to capacitor damage to the spacer (plasma) etcher and etch time.

What is needed is an improved decoupling capacitor fabrication process whereby the capacitance is not further reduced but instead further increased.

SUMMARY OF THE INVENTION

An embodiment of the present invention is a decoupling capacitor structure fabricated on a substrate surface comprising:

a capacitor having first and second conductively doped polysilicon electrodes or silicided conductively doped polysilicon electrodes and a capacitor dielectric therebetween.

A second embodiment of the present invention is a decoupling capacitor structure fabricated on a substrate surface comprising:

a first capacitor having first and second electrodes and a first capacitor dielectric therebetween; and a second capacitor coupled either in series or in parallel to the first capacitor, with the second capacitor having first and second electrodes and a second capacitor dielectric therebetween;

wherein the first capacitor and the second capacitor share a common electrode.

The process used to fabricate the decoupling capacitor on a conductive substrate surface comprises the steps of:

forming a first insulating layer over the conductive substrate surface;

forming a first conductive layer over the first insulating layer;

patterning the first conductive layer and the first insulating layer to form a first decoupling capacitor;

forming diffusion areas aligned to the patterned edges of the first conductive layer and the insulating layer;

forming insulating spacers adjacent the patterned edges;

forming a second insulating layer over the patterned first conductive layer;

forming a second conductive layer over the second insulating layer; and patterning the second conductive layer and the second insulating layer to form a second decoupling capacitor.

EMBODIMENTS OF THE INVENTION

Figure 1:
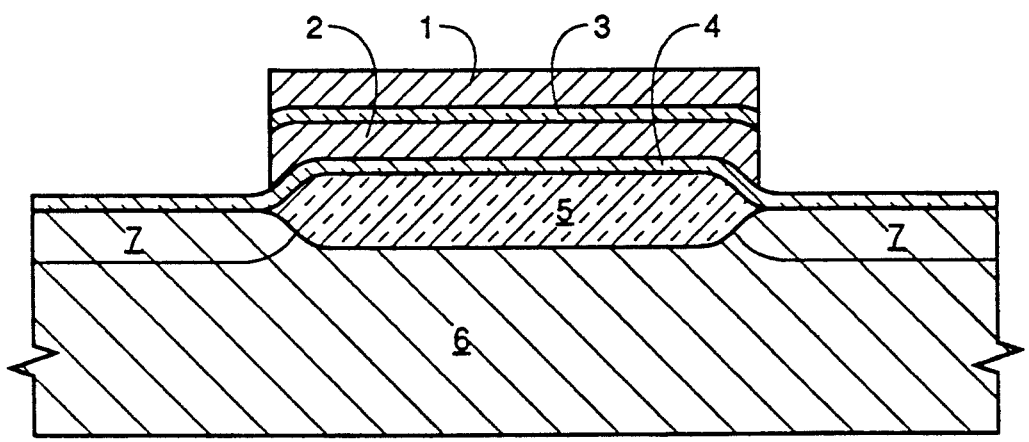
FIG. 1 is a cross-sectional view of an in-process wafer portion depicting the early process steps of the present invention.
Figure 2:
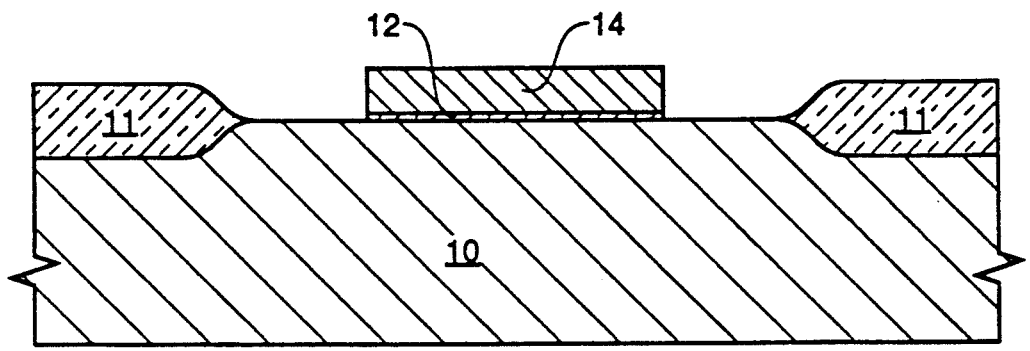
FIG. 2 depicts a cross-sectional view of an in-process wafer portion of FIG. 1 depicting a decoupling capacitor of the present invention.
Figure 3:
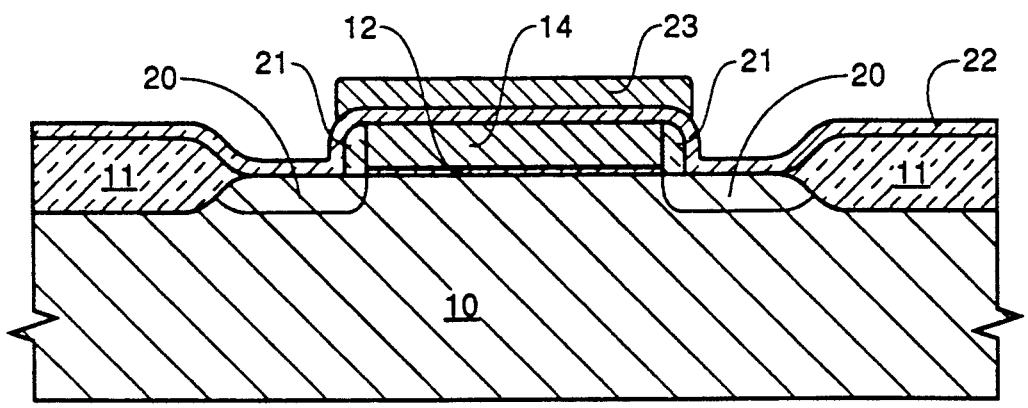
FIG. 3 depicts a cross-sectional view of an in-process wafer portion of FIG. 1 depicting a pair of decoupling capacitors of the present invention.

Embodiments of the present invention includes the process steps described in FIGS. 1–3.

As a first embodiment and referring now to FIG. 1, a single decoupling capacitor can be formed from polysilicon plates 1 and 2 with capacitor dielectric 3 sandwiched in between. Plates 1 and 2 preferably comprise conductively doped polysilicon or silicide conductively doped polysilicon while the capacitance dielectric comprises TEOS, silicon, silicon nitride or any combination thereof.

As a second embodiment and referring now to FIG. 2, a silicon substrate 10 is prepared using conventional process steps wherein the silicon substrate is doped with impurities to form a p-type substrate. Thick field oxide 11 has been formed in areas surrounding locations that define locations for future decoupling capacitors. Then, a layer of thin oxide 12 is formed to blanket the surface of the entire silicon substrate. Next, a blanket conductive layer is deposited that comprises conductively doped polysilicon or silicide polysilicon (such as tungsten silicide). This blanket layer of conductive material and the thin oxide 12 are then patterned and etched to form a conductive plate 14 overlying patterned oxide 12. Conductive plate 14, patterned oxide 12 and the underlying p− type substrate 10 form a first decoupling capacitor.

Referring now to FIG. 3, diffusion regions 20 have been implanted into substrate 10 with n+type impurities thereby aligning to the patterned edges of conductive plate 14 and oxide 12. These diffusion regions 20 provide contact regions between the substrate 10 and metal bus lines (not shown) that are formed in later process steps by conventional methods.

Continuing with the process of the present invention, insulating spacers 21 (typically formed from oxide) are formed about the patterned edges of conductive plate 14 and oxide 12. Then, a blanketing layer of insulating material 22, possessing good dielectric qualities, is formed (it is preferred to use insulating materials such as TEOS, oxide, nitride or any combination thereof). Next, a second blanketing conductive layer comprising conductively doped polysilicon or silicided polysilicon (such as tungsten silicided polysilicon) is formed.

The conductive layer and the insulating layer 22 are present to provide several functions. One function being that these layers protect conductive layer 13 from subsequent processing such as etches or implants that could damage conductive layer 13 by reducing the surface area of the capacitor plate electrode or that cause popping whereby the conductive plate 13 is shorted to the underlying substrate 10. A second function being that the conductive layer is patterned to form a second conductive plate 23 which is used to form a second decoupling capacitor comprising conductive plate 23, insulating layer 22 and conductive plate 14. These two decoupling capacitors can then be coupled in series or in parallel depending on the designer's choice. If connected in series, shorts between power and ground, at particular locations on the die, can be prevented. If connected in parallel, the result could be an increase of the overall decoupling capacitance by more than 2×. This capacitance increase effectively provides greater noise reduction between power and ground supplied to a silicon device.

Although the present invention is described in several embodiments, it will be apparent to one skilled in the art that changes and modifications may be made thereto without departing from the spirit and scope of the invention as claimed. For example, the preferred conductive electrodes of the decoupling capacitors comprise conductively doped polysilicon or a silicided conductively doped polysilicon, however other conductive materials, such as metals, can be substituted therefor.

We claim:

1. A method for forming a decoupling capacitor structure comprising a first decoupling capacitor and a second decoupling capacitor fabricated on a conductive substrate surface comprising the steps of:
   a) forming a first insulating layer over said conductive substrate surface;
   b) forming a first conductive layer over said first insulating layer;
   c) patterning said first conductive layer and said first insulating layer thereby resulting in patterned edges on said first conductive layer and said first insulating layer, said patterning further forms said first decoupling capacitor, wherein said conductive substrate serves as a first capacitor plate, said first conductive layer serves as a second capacitor plate and said first insulating layer serves as an insulator therebetween;
   d) forming diffusion areas aligned to the patterned edges of said first conductive layer and said insulating layer;
   e) forming insulating spacers adjacent said patterned edges;
   f) forming a second insulating layer over the patterned first conductive layer;
   g) forming a second conductive layer over said second insulating layer; and
   h) patterning said second conductive layer and said second insulating layer to form a second decoupling capacitor, wherein said first capacitor's second plate serves as a first capacitor plate to said second decoupling capacitor, said second conductive layer serves as said second decoupling capacitor's second capacitor plate and said second insulating layer serves as an insulator therebetween.

2. The method of claim 1, wherein a layer of silicided material is formed on at least one of said first and second conductive layers.

3. The method of claim 2, wherein a layer of silicided material is formed on both said first and second conductive layers.

4. The method of claim 2, wherein silicided material is tungsten silicide.

5. The method of claim 3, wherein silicided material is tungsten silicide.

6. The method of claim 1, wherein said first insulating layer is silicon oxide.

7. The method of claim 1, wherein said second insulating layer comprises a dielectric material selected from the group consisting of TEOS, silicon oxide, silicon oxide and any combination thereof.

8. A method for forming a decoupling capacitor structure comprising a first decoupling capacitor and second decoupling capacitor fabricated on a conductive silicon substrate of an integrated circuit comprising the steps of:
   a) forming a first insulating layer over said conductive substrate surface;
   b) forming a first conductive polysilicon layer over said first insulating layer;
   c) patterning said first conductive polysilicon layer and said first insulating layer thereby resulting in patterned edges on said first conductive layer and said first insulating layer, said patterning further forms said first decoupling capacitor, wherein said conductive substrate serves as a first capacitor plate, said first conductive serves as a second capacitor plate and said first insulating layer serves as a first capacitor dielectric therebetween;
   d) implanting conductive impurities into said conductive silicon substrate thereby forming diffusion areas aligned to the patterned edges of said first conductive polysilicon layer and said insulating layer;
   e) forming insulating spacers adjacent said patterned edges;
   f) depositing a second insulating layer over the patterned first conductive polysilicon layer;
   g) depositing a second conductive polysilicon layer over said second insulating layer; and
   h) patterning said second conductive polysilicon layer and said second insulating layer for form a second decoupling capacitor, said second decoupling capacitor, wherein said first capacitor's second plate serves as a first capacitor plate to said second decoupling capacitor, said second conductive layer serves as said second decoupling capacitor's second capacitor plate and said second insulating layer serves as a second capacitor dielectric therebetween.

9. The method of claim 8, wherein a layer of silicided material is formed on at least one of said first and second conductively doped polysilicon layers.

10. The method of claim 8, wherein a layer of silicided material is formed on both said first and second conductively doped polysilicon layers.

11. The method of claim 9, wherein silicided material comprises tungsten silicide.

12. The method of claim 10, wherein silicided material comprises tungsten silicide.

13. The method of claim 8, wherein said first capacitor dielectric is silicon oxide.

14. The method of claim 8, wherein said second capacitor dielectric comprises a dielectric material selected from the group consisting of TEOS, silicon oxide, silicon nitride and any combination thereof.

* * * * *